US006975979B2

(12) United States Patent
Akimoto et al.

(10) Patent No.: US 6,975,979 B2
(45) Date of Patent: Dec. 13, 2005

(54) METHOD AND COMPUTER SOFTWARE PRODUCT FOR CALCULATING AND PRESENTING A NUMERICAL VALUE REPRESENTATIVE OF A PROPERTY OF A CIRCUIT

(75) Inventors: Tetsuya Akimoto, Tokyo (JP); Morihisa Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/347,409

(22) Filed: Jul. 6, 1999

(65) Prior Publication Data

US 2003/0158713 A1 Aug. 21, 2003

(30) Foreign Application Priority Data

Jul. 6, 1998 (JP) .................................. 10-190685

(51) Int. Cl.⁷ ............................................ G06F 17/50
(52) U.S. Cl. ............................ 703/19; 703/2; 703/13; 702/117; 716/6
(58) Field of Search .......................... 703/19, 13, 2; 702/117; 716/6

(56) References Cited

U.S. PATENT DOCUMENTS

| | | | | |
|---|---|---|---|---|
| 5,446,676 A | * | 8/1995 | Huang et al. .................. 703/19 |
| 5,615,377 A | * | 3/1997 | Shimizu et al. .............. 324/769 |
| 5,841,672 A | * | 11/1998 | Spyrou et al. .................. 716/6 |
| 5,852,445 A | * | 12/1998 | Yoshikawa et al. .......... 345/440 |
| 5,974,247 A | * | 10/1999 | Yonezawa .................... 324/765 |
| 6,047,247 A | * | 4/2000 | Iwanishi et al. .............. 703/19 |
| 6,278,964 B1 | * | 8/2001 | Fang et al. .................... 703/14 |

FOREIGN PATENT DOCUMENTS

| | | |
|---|---|---|
| JP | 9-260498 | 10/1997 |
| JP | 10-124565 | 5/1998 |
| JP | 10-228497 | 8/1998 |
| JP | 11-154168 | 6/1999 |

OTHER PUBLICATIONS

Quader et al., "Hot-carrier-reliability design guidelines for CMOS logic circuits", IEEE Journal of Solid-State Circuits, vol. 29, Issue 3, Mar. 1994, pp 253-262.*
Minehane et al., "Direct BSIM3v3 parameter extraction for hot-carrier reliability simulation of N-channel LDD MOSFETs", Proceedings of the 1997 6th International Symposium on Physical & Failure Analysis of Integrated Circuits, 1997, pp 133-139.*
Translated copy of "Reason For Rejection", Japanese Office Action, Jul. 12, 2000.*

* cited by examiner

Primary Examiner—Jean R. Homere
Assistant Examiner—Herng-der Day
(74) Attorney, Agent, or Firm—Sughrue Mion, PLLC

(57) ABSTRACT

To calculate pin-to-pin delay time, which is delay time from the input pin to the output pin of a logic block, and block-to-block delay time, which is delay time from an output pin of one block to an input pin of the next block, firstly, the pin-to-pin delay time and the block-to-block delay time are calculated with negligence in aging caused by a hot carrier effect, secondly, degradations caused by aged transistors connected to the input pin and the output pin, and lastly, the pin-to-pin delay time and block-to-block delay time are modified by the degradation rate.

4 Claims, 4 Drawing Sheets

100
A CONVENTIONAL METHOD OF
CALCULATING AGED DELAY TIME
OF A LOGIC LEVEL CIRCUIT

400 DELAY TIME CALCULATION METHOD

METHOD AND COMPUTER SOFTWARE PRODUCT FOR CALCULATING AND PRESENTING A NUMERICAL VALUE REPRESENTATIVE OF A PROPERTY OF A CIRCUIT

BACKGROUND OF THE INVENTION

This invention relates to a method of designing a semiconductor integrated circuit, and, in particular, to a method of verifying reliability of the semiconductor integrated circuit.

In a semiconductor integrated circuit, a delay time is caused to occur in an electronic circuit when the electronic circuit includes MOS (Metal Oxide Semiconductor) transistors. Recent years, MOS transistors tend to become very small in size. This makes it impossible to ignore an influence from a hot carrier effect. Moreover, the delay time is also varied by an influence of aging caused by the hot carrier effect.

In a conventional calculation method of the aged delay time, a difference, namely, a degradation rate between delay times before and after aging is calculated from information (input pin information) concerned with each input pin of a logic block and information (input pin device information) concerned with a device connected to the input pin. Hereinafter, the difference or a degradation rate will be called an delay time degradation rate. And then, the aged delay time is calculated from the delay time degradation rate.

Herein, input pin information concerned with rounding and a frequency of waveform inputted to a logic block is provided from a logic level circuit formed by the logic blocks. On the other hand, input pin device information is provided from devices inside of a logic block.

The conventional calculation method will be described in detail with reference to FIG. 1 and is specified by a delay time calculation method depicted by 100. The delay time calculation method is for calculating aged delay time of a logic level circuit. In this method, delay time degradation rate calculation 105 is executed to calculate the aging degradation amount or rate which occurs in one logic block. Such the delay time degradation rate calculation 105 is carried out on the basis of input pin information 102, passage time information 103 and input pin device information 104. The calculation 105 is iterated to all of logic blocks comprising a logic level circuit. From the result of repeated calculation 105, aged delay time calculation 106 is executed and finally, a calculation result 107 is gained.

As mentioned above, in the conventional method of calculating aged delay time of a logic level circuit, the aged delay time of each logic blocks is based only on the input pin information and then the result is applied for a calculation of aged delay time of whole of the logic level circuit. In this method, the accuracy of the aged delay time is low except that each logic block is composed of an inverter of one-stage transistor gate.

In another conventional method, the aged delay time can be obtained with a high accuracy. However, to accomplish such a high accuracy, each of the logic blocks should be separated into a great number of transistor gates to calculate rounding and a frequency of waveform through each transistor gate, instead of calculating the aging degradation amount at each logic block. Specifically, the calculation of aged delay time should be executed each of all transistors included in a logic level circuit. In short, high accuracy and a small amount of calculation have a tradeoff relationship in these methods.

SUMMARY OF THE INVENTION

It is an object of the present invention to provide methods and computer software products for calculating an aged delay time of a logic level circuit caused by the hot carrier effect, with both high accuracy and little calculation.

According to this invention, a method for calculating a numerical value $V_A$, which shows a property of a logic level circuit, from a numerical value $V_B$, which shows a property of a logic block constituting the logic level circuit, comprises the following steps:

(a) calculating the $V_B$ from numerical value $V_C$'s each of which shows property of a transistor constituting part of the logic block; and, (b) calculating the $V_A$ from the $V_B$.

In the above mentioned method at step (a), one $V_C$ may show a property of a transistor connected to an input pin of the logic block and another $V_C$ may show a property of a transistor connected to an output pin of the logic block.

According to this invention, a method for calculating a delay time of a signal passing through a logic level circuit is provided. The logic level circuit consists of a plurality of logic blocks. This method calculates the delay time from pin-to-pin delay time, which is delay time of a signal passing between an input pin and an output pin of a logic block, and block-to-block delay time, which is delay time of a signal passing between two logic blocks connected to each other. Furthermore, this method comprises the following steps:

(a) calculating the pin-to-pin delay time and the block-to-block delay time without calculating in aging caused by hot carrier effect;

(b) calculating variations of delay times that signals pass through transistors connected to the input and output pin caused by said aging; and, (c) modifying the pin-to-pin delay time and the block-to-block delay time calculated in step (a) by the variations calculated in step (b).

According to this invention, a method for calculating pin-to-pin delay time $T_{iopath\_aged}$ and block-to-block delay time $T_{connect\_aged}$ is provided. The pin-to-pin delay time $T_{iopath\_aged}$ is delay time of a signal passing between an input pin and an output pin of a logic block. The block-to-block delay time $T_{iopath\_aged}$ is delay time of a signal passing between said two logic blocks connected to each other. Furthermore, this method comprises the following steps:

(a) calculating an amount of stress $S_{in}$ cast by the input pin and an amount of stress $S_{out}$ cast by the output pin according to the following expression:

$$S = \alpha \left(\frac{C}{W}\right)^\beta$$

when it is assumed that a load capacitance is represented by C[pF], constants depending on change of inputted waveform are represented by $\alpha$ and $\beta$, and width of channel of the transistor connected to the pin is represented by W[$\mu$m];

(b) calculating an aged delay time of the input pin $\delta_{in}$[%] and an aged delay time $\delta_{out}$[%] according to the following expression:

$$\delta = \gamma \left( \frac{\tau S f}{\varepsilon_1 e^{\kappa T}} \right)^{\frac{1}{\varepsilon_2}}$$

when it is assumed that a constant depending on physical structure of the pin is represented by γ, the term of a guarantee of the LSI is represented by τ [hour], constants depending on process are represented by $\varepsilon_1$ $\varepsilon_2$ and κ, working frequency is represented by f[Hz], and absolute temperature is represented by T[K];

(c) calculating the pin-to-pin delay time $T_{iopath\_aged}$ and the block-to-block delay time $T_{connect\_aged}$ according to the following expressions:

$T_{connect\_aged} = T_{connect\_fresh}(1 + \lambda_{out}\delta_{out})$ $T_{iopath\_aged} = T_{iopath\_fresh}(1 + \lambda_{in}\delta_{in} + \lambda_{out}\delta_{out})$ when it is assumed that pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at the input stage and the output stage to whole delay time occurred from the input pin to the output pin are represented by $\lambda_{in}$ and $\lambda_{out}$.

According to this invention, a method for calculating a delay time occurred to a signal passing through a logic level circuit that consists of a plurality of logic blocks comprises the following steps:

(a) calculating delay times of all said logic blocks according to the method mentioned above; and,
(b) calculating the delay time of the logic level circuit from the result of step (a).

According to this invention, a computer software product for calculating a numerical value $V_A$, which shows a property of a logic level circuit, from a numerical value $V_B$, which shows a property of a logic block constituting the logic level circuit makes a computer execute the following processes:

(a) calculating the $V_B$ from numerical value $V_C$'s each of which shows property of a transistor constituting part of the logic block; and,
(b) calculating the $V_A$ from the $V_B$.

In the above mentioned computer software product at process (a), one $V_C$ may show a property of a transistor connected to an input pin of the logic block and another $V_C$ may show a property of a transistor connected to an output pin of the logic block.

According to this invention, a computer software product for calculating a delay time of a signal passing through a logic level circuit that consists of a plurality of logic blocks is provided. This computer software product calculates a delay time from pin-to-pin delay time and block-to-block delay time. The pin-to-pin delay time is delay time of a signal passing between an input pin and an output pin of a logic block. The block-to-block delay time is delay time of a signal passing between two logic blocks connected to each other. Furthermore, the computer software product makes a computer execute the following processes:

(a) calculating the pin-to-pin delay time and the block-to-block delay time without calculating in aging caused by hot carrier effect;
(b) calculating variations of delay times that signals pass through transistors connected to the input and output pin caused by said aging; and,
(c) modifying the pin-to-pin delay time and the block-to-block delay time calculated in step (a) by the variations calculated in step (b).

According to this invention, a computer software product for calculating pin-to-pin delay time $T_{iopath\_aged}$ and block-to-block delay time $T_{iopath\_aged}$ is provided. The pin-to-pin delay time $T_{iopath\_aged}$, is delay time of a signal passing between an input pin and an output pin of a logic block. The block-to-block delay time $T_{connect\_aged}$, which is delay time of a signal passing between said two logic blocks connected to each other. And then, the computer software product makes a computer execute the following processes:

(a) calculating an amount of stress $S_{in}$ cast by the input pin and and an amount of stress $S_{out}$ cast by the output pin according to the following expression:

$$S = \alpha \left( \frac{C}{W} \right)^\beta$$

when it is assumed that a load capacitance is represented by C[pF], constants depending on change of inputted waveform are represented by α and β, and width of channel of the transistor connected to the pin is represented by W[μm];

(b) calculating an aged delay time of the input pin δ in [%] and an aged delay time δ out [%] according to the following expression:

$$\delta = \gamma \left( \frac{\tau S f}{\varepsilon_1 e^{\kappa T}} \right)^{\frac{1}{\varepsilon_2}}$$

when it is assumed that a constant depending on physical structure of the pin is represented by γ, the term of a guarantee of the LSI is represented by τ [hour], constants depending on process are represented by $\varepsilon_1$ $\varepsilon_2$ and κ, working frequency is represented by f[Hz], and absolute temperature is represented by T[K];

(c) calculating the pin-to-pin delay time $T_{iopath\_aged}$ and the block-to-block delay time $T_{connect\_aged}$ according to the following expressions:

$T_{connect\_aged} = T_{connect\_fresh}(1 + \lambda_{out}\delta_{out})$ $T_{iopath\_aged} = T_{iopath\_fresh}(1 + \lambda_{in}\delta_{in} + \lambda_{out}\delta_{out})$ when it is assumed that pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at the input stage and the output stage to whole delay time occurred from the input pin to the output pin are represented by $\lambda_{in}$ and $\lambda_{out}$.

According to this invention, a computer software product for calculating a delay time occurred to a signal passing through a logic level circuit that consists of a plurality of logic blocks makes a computer execute the following processes:

(a) calculating delay times of all said logic blocks according to the above-mentioned product; and,
(b) calculating the delay time of the logic level circuit from the result of step (a).

DESCRIPTION OF THE PREFERRED EMBODIMENTS

(1) First Embodiment

Figure 1:
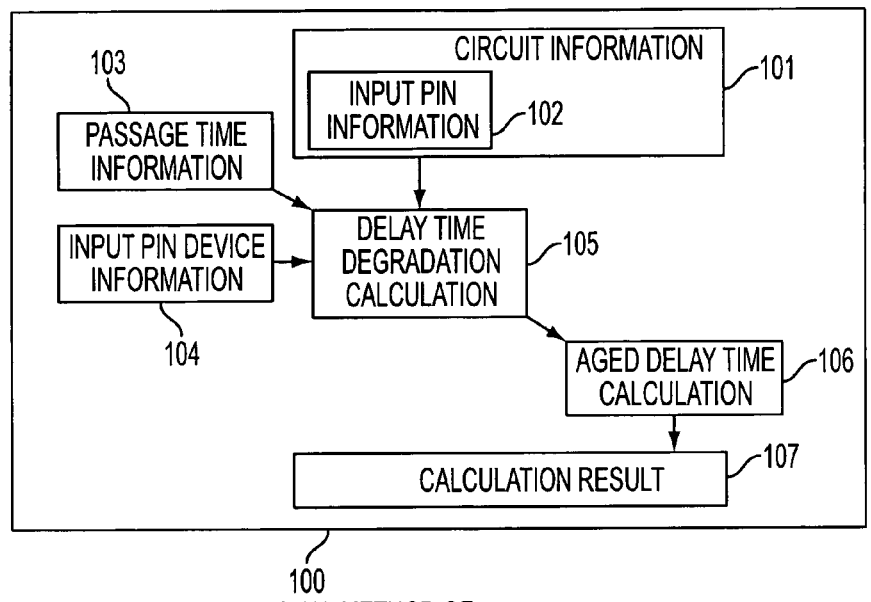
FIG. 1 shows a block diagram for use in schematically describing a conventional method for calculating an aged delay time of a logic level circuit.
Figure 2:
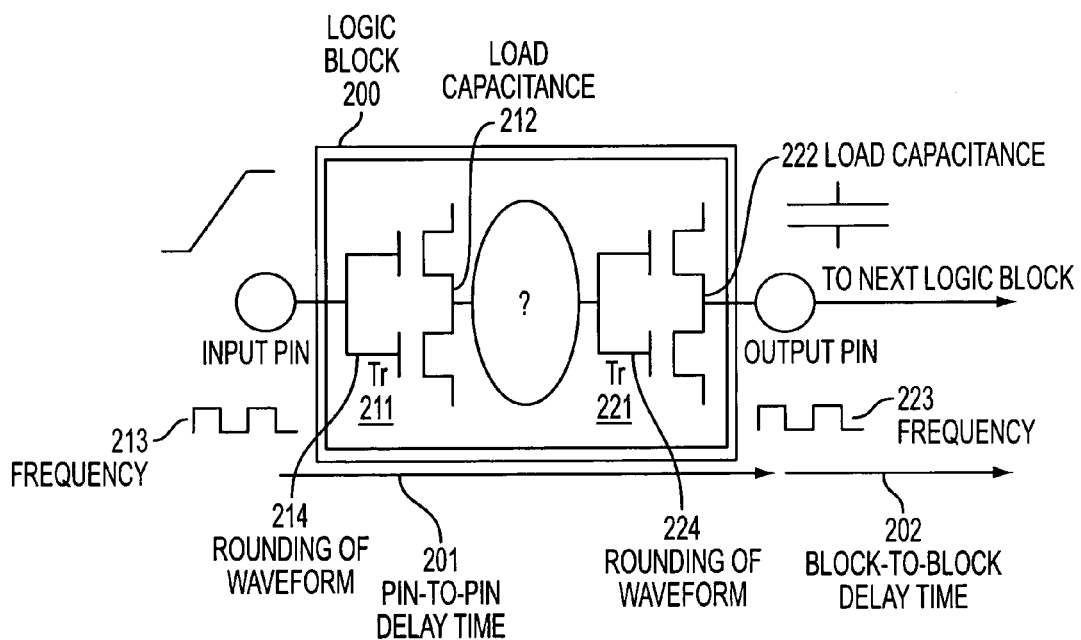
FIG. 2 shows an relationship among inner information of a logic block, outskirts information of a logic block, a pin-to-pin delay time and a block-to-block delay time.

Referring to FIG. 2, description will be made about a method according to a first embodiment of the present invention, which is used to calculate an delay time of a logic block. The logic block includes N-channel transistors. With the passage of time, all of the N-channel transistors are aged and suffer from degradation in delay time due to a hot carrier effect, especially, a hot electron effect.

According to the inventors' experimental studies, it has been found out that the N-channel transistors in the part shown by the question mark "?" in FIG. 2 scarcely influence rounding (wave distortion) of waveform and load capacitance because distances between the transistors are short on one hand. On the other hand, it has been also found out that the N-channel transistors Tr 211 and Tr 221 connected directly to the input and output pin tend to seriously influence these effects as a result of layout and connection design of a logic circuit. Consequently, it is very effective to calculate the effect of hot electron only in connection with the N-channel transistor Tr 211 and Tr 221.

In general, a logic level circuit is divided into a plurality of logic blocks which may be considered as a minimum unit of the logic level circuit. In this event, it is necessary to acquire information concerning inner transistors for the calculation at every one of the logic blocks. In consequence, aged degradation amounts or rates between delay times before and after aging of Tr 211 and Tr 221 are calculated on the basis of information about load capacitance 212, rounding of waveform 214 caused by inner circuit of a logic block, the size of N-channel transistor, and coefficient for calculating delay time degradation rate.

The delay time degradation rate of an input pin $\delta_{in}(\%)$ is calculated by the next expression:

$$\delta_{in} = \gamma_{in}\left(\frac{\tau_{ac}S_{in}f_{in}}{\varepsilon_1 e^{\kappa T}}\right)^{\frac{1}{\varepsilon_2}} \tag{1}$$

$\gamma_{in}$: constant depending on physical structure of the input pin;

$\tau_{ac}$(hour): guaranteed duration of LSI;
$S_{in}$: stress of input pin;
$f_{in}$ (Hz): frequency at input pin; and
T (K): absolute temperature.
$S_{in}$ is calculated by the next expression:
$C_{in}$(pF): load capacitance of transistor connected to input pin;

$$S_{in} = \alpha\left(\frac{C_{in}}{W_{in}}\right)^{\beta} \tag{2}$$

$\alpha, \beta$: constants depending on rounding of waveform of input pin; and
$W_{in}(\mu m)$: width of N-channel transistor connected to input pin.

The delay time degradation rate of output pin $\delta_{in}(\%)$ is calculated by the next expression:
$\gamma_{out}$: Out constant depending on physical structure of output pin;

$$\delta_{out} = \gamma_{out}\left(\frac{\tau_{ac}S_{out}f_{out}}{\varepsilon_1 e^{\kappa T}}\right)^{\frac{1}{\varepsilon_2}} \tag{3}$$

$S_{out}$: stress of output pin; and
$f_{out}$(Hz); frequency at output pin.

$$S_{out} = \alpha\left(\frac{C_{out}}{W_{out}}\right)^{\beta} \tag{4}$$

To modify pin-to-pin delay time for delay time degradation rate caused by the hot electron effect, the delay time degradation rate of Tr 211, which is connected to the input pin, is considered to calculate the pin-to-pin delay time. Similarly, the delay time degradation rate of Tr 221, which is connected to the output pin, is considered to calculate both the pin-to-pin delay time and the block-to-block delay time. According to this concept, it is possible to calculate pin-to-pin delay time and block-to-block delay time modified for the hot electron effect. Pin-to-pin delay time $T_{iopath\_aged}$(ps) modified for delay time degradation rate and block-to-block delay time $T_{connect\_aged}$(ps) modified for delay time degradation rate are given by the next expressions:

$$T_{iopath\_aged} = T_{iopath\_fresh}(1 + \lambda_{in}\delta_{in} + \lambda_{out}\delta_{out}) \tag{5}$$

$$T_{connect\_aged} = T_{connect\_fresh}(1 + \lambda_{out}\delta_{out}) \tag{6}$$

$\lambda_{in}$: the ratio of the delay time occurred at the input pin to the delay time between the input pin and the output pin; and
$\lambda_{out}$: the ratio of the delay time occurred at the output pin to the delay time between the input pin and the output pin.

(2) Second Embodiment

Figure 3:
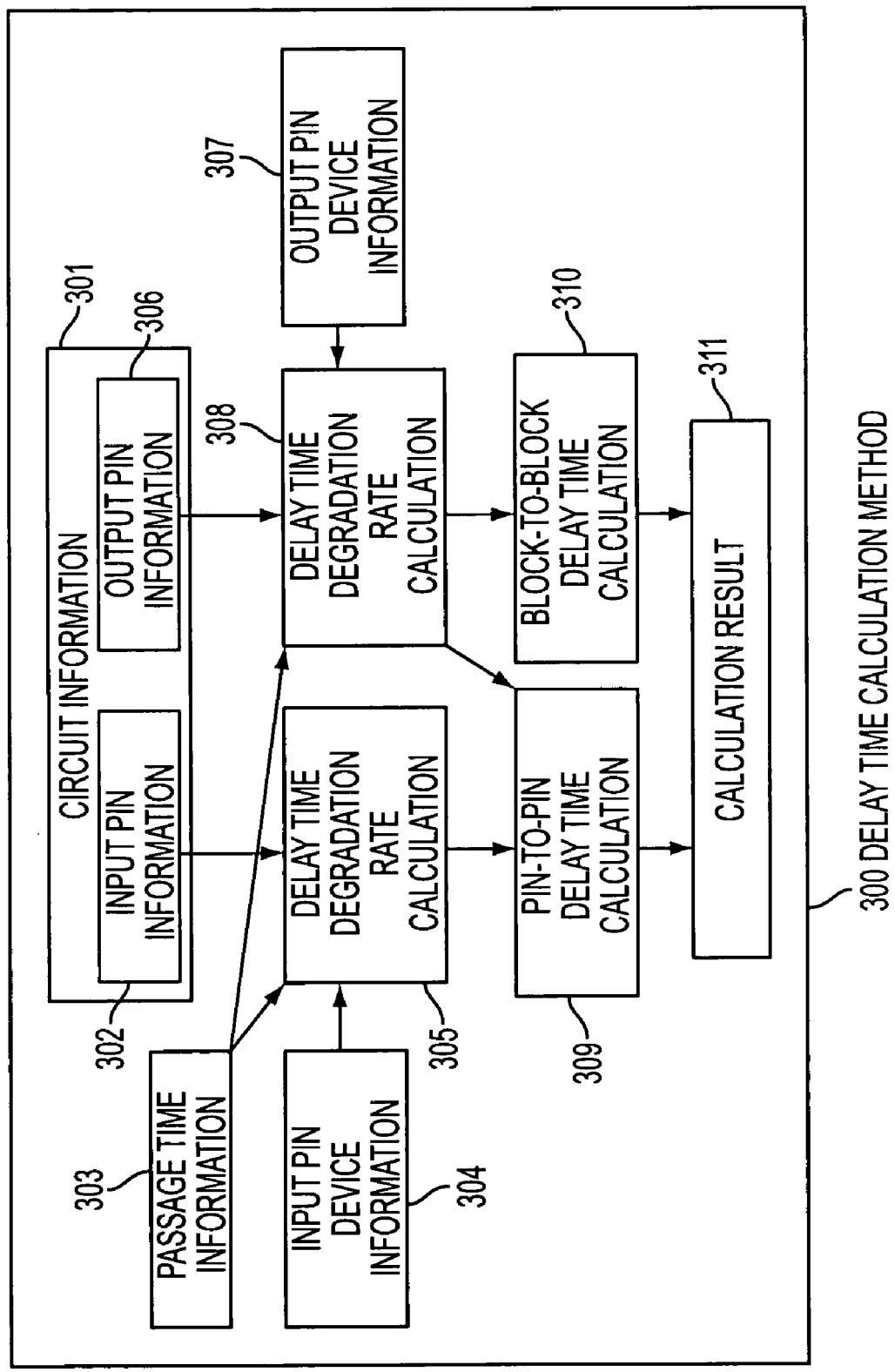
FIG. 3 shows a block diagram for use in schematically describing a method for calculating an aged delay time of a logic level circuit comprising logic blocks in accordance with the present invention.

Next, description will be made about a method for calculating delay time of a logic level circuit, which is the second embodiment of the present invention referring to FIG. 3. In this method, the logic level circuit comprises a plurality of logic blocks.

By giving attention to one logic block included in the logic level circuit, the input pin information 302, passage time information 303 and input pin device information 304 are assembled. The passage time information 303 is given in the form of year. And then, the delay time degradation rate, which is caused to occur at the N-channel transistor connected to the input pin of the logic block, is calculated in the delay degradation calculation 305. Herein, the input pin information 302 is part of circuit information 301 calculated for the logic level circuit according to the input pin. And herein, the input pin device information 304 is concerned with an inside circuit of the logic block.

Similarly to the delay time degradation rate calculation 305, the delay time degradation rate related to the output pin is calculated in the delay time degradation rate calculation 308. By paying attention to one logic block included in the logic level circuit, the passage time information 303, the output pin information 306, and output pin device information 307 are assembled. And then, the delay time degradation rate, which is occurred at the N-channel transistor connected to the output pin of the logic block, is calculated in the delay time degradation rate calculation 308. Herein, the output pin information 306 is part of circuit information 301 calculated for the logic level circuit according to the output pin. And herein, the output pin device information 307 is concerned with devices of the logic block.

The results of the delay time degradation rate calculation 305 and 308 are used or applied in the pin-to-pin delay time calculation 309. Furthermore, the result of the calculation 308 is given to the block-to-block delay time calculation 310. Finally, the calculation result 311 is acquired from the result of the pin-to-pin delay time calculation 309 and the block-to-block delay time calculation 310.

(3) Third Embodiment

Next, description will be made about the third embodiment of the present invention referring to FIG. 4. This embodiment is a method for calculating delay time of a logic level circuit when the delay time is aged because of the hot electron effect.

At first, delay time calculation 402 and operating frequency calculation 403 are executed on the basis of logic level circuit information 401. On the one hand, the delay time calculation 402 is a conventional method for calculating delay time without reference to the hot electron effect. And the delay time calculation 402 calculates rounding of waveform at input pin, load capacitance at output pin, pin-to-pin delay time, and block-to-block delay time by each of logic block included in the logic level circuit. On the other hand, the operating frequency calculation 403 is a kind of method for calculating operating frequency by using a probability propagation technique. And the operating frequency calculation 403 calculates frequency with which input and output pin of each logic block in the logic level circuit are driven.

The result of the delay time calculation 402 is produced as input pin information 404 and delay time 406. The result of the operating frequency calculation 403 is produced as output pin information 405. The input pin information 404 comprises rounding of waveform and operating frequency at the input pin. The output pin information 405 comprises load capacitance and operating frequency at the output pin. The delay time 406 comprises both pin-to-pin delay time and block-to-block delay time.

In addition to the input pin information 404 and output pin information 405, input pin device information 407 and output pin device information 408 are used in delay time degradation rate calculation 409 and 410. The input pin device information 407 is concerned to inside of a logic block, and herein, shows some coefficients of expression (1) and (2) like as channel width of N-channel transistor connected to input pin.

The delay time degradation rate calculation 409 and 410 calculate degradation rate between delay times before and after passing time from rounding of inputted waveform, output load capacitance, operating frequency, and size of N-channel transistor of input and output pin. According to the expression (1) and (2), the calculation 409 calculates the degradation rate of input pin in application of rounding of waveform at input pin calculated in the delay time calculation 402, operating frequency calculated in the frequency calculation 403, and the size of N-channel transistor connected to input pin and other coefficients assembled from the input pin device information 407. Similarly, according to the expression (3) and (4), the calculation 410 is for calculating the degradation of output pin in application of load capacitance at output pin, operating frequency calculated in the frequency calculation 403, and the size of N-channel transistor connected to output pin and other coefficients assembled from the output pin device information 408.

After execution of the delay time degradation calculation 409 and 410, pin-to-pin delay time degradation 411 is calculated from the degradations of input and output pins. Similarly, block-to-block delay time degradation 412 is calculated from the degradation of output pin. Referring to these degradations, delay time modification 413 is executed to modify the delay time 406 calculated in the delay time calculation 402 according to the expression (5) and (6). Finally, calculation result 414 is calculated.

(4) Derivation of Expressions

Hereinafter, description will be made about how to derive the expressions from (1) to (6).

(4-1) Derivation of the Expression (1) and the Expression (3)

In MOS transistor, degradation caused by hot carriers exponentially progresses in accordance DC stress time $t_{dc}$. The degradation is denoted by D and is given by:

$$D = (At_{dc})^n \quad (7)$$

In the above expression, n and A depend on process and bias.

On the other hand, the degradation D is given by the following expressions with drain current $I_{ds}$ and mutual conductance $g_m$:

$$D = \frac{I_{ds} - I_{ds0}}{I_{ds0}} = \Delta I_{ds} \quad (8)$$

$$D = \frac{g_m - g_{m0}}{g_{m0}} = \Delta g_m \quad (9)$$

Furthermore, the degradation D is shown by:

$$D = \left\{ \frac{I_{ds}}{BW} \left( \frac{I_{sub}}{I_{ds}} \right)^m t_{dc} \right\}^n \quad (10)$$

In the above, W is the channel width of transistor. B and m depend on process and bias. The expression (10) is proposed by C. Hu (C. Hu et al. IEEE Transaction on Electron Devices Vol. ED-32, No. 2, pp375, 1985).

When a value "age" is given by the next expression:

$$age = \frac{I_{ds}}{BW}\left(\frac{I_{sub}}{I_{ds}}\right)^m t, \quad (11)$$

the age under DC bias stress ageDC($t_{dc}$) is given by the following:

$$ageDC(t_{dc}) = \frac{I_{ds}}{BW}\left(\frac{I_{sub}}{I_{ds}}\right)^m t_{dc}, \quad (12)$$

and the age under AC bias stress ageAC($t_{ac}$) is given by the following:

$$ageAC(t_{ac}) = \int_0^{t_{ac}} \frac{I_{ds}}{BW}\left(\frac{I_{sub}}{I_{ds}}\right)^m dt \quad (13)$$

In the case where AC bias has an interative waveform at a period T, the expression (13) is transformed into:

$$ageAC(t_{ac}) = \frac{t_{ac}}{T}\int_0^{ac} \frac{I_{ds}}{BW}\left(\frac{I_{sub}}{I_{ds}}\right)^m dt \quad (14)$$

On the condition that DC stress is equal to AC stress, the following holds:

$$ageDC(t_{dc}) = ageAC(t_{ac}) \quad (15)$$

By making a substitution the expressions (12) and (14) for the expression (15), assuming that f=1/T, the following expressions (16) and (17) hold:

$$R = \frac{t_{dc}}{t_{ac}} = \frac{\frac{1}{T}\int_0^T \frac{I_{ds}}{BW}\left(\frac{I_{sub}}{I_{ds}}\right)^m dt}{\left.\frac{I_{ds}}{BW}\left(\frac{I_{sub}}{I_{ds}}\right)^m\right|_{dc}} \quad (16)$$

$$= Sf \quad (17)$$

In the case where the objective circuit of the calculation is like an inverter on the conditions that the voltage of inputted signal changes from 0 to $V_{DD}$ ($V_{DD}$ to 0), and the voltage of output signal changes from $V_{DD}$ to 0 (0 to $V_{DD}$), the following holds:

$$ageAC(t)>0:0<\text{input}<V_{DD},\ 0<\text{output}<V_{DD}\ \sim 0:\text{input}=0\ \text{or}\ V_{DD},\ \text{output}=0\ \text{or}\ V_{DD} \quad (18)$$

Figure 4:
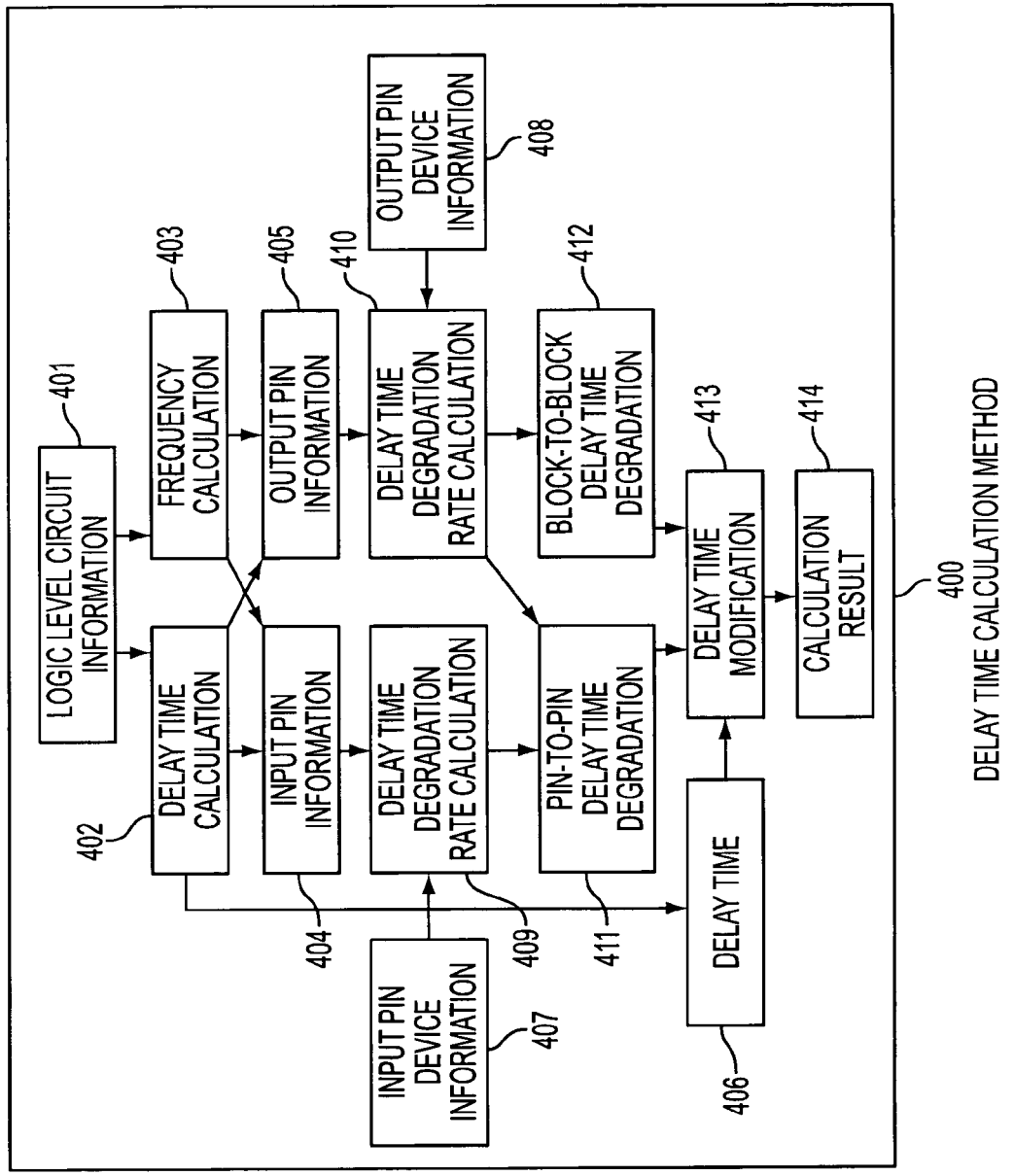
FIG. 4 shows a block diagram for use in schematically describing a method for calculating aged delay time of a logic level circuit in aging caused by the hot electron effect.
Figure 5:
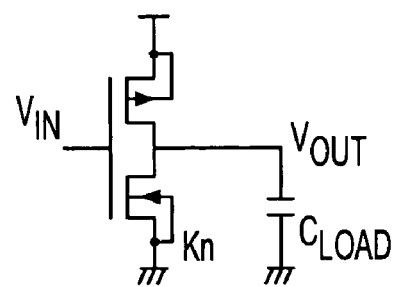
FIG. 5 shows a diagram for use in schematically describing propagation delay time tpd when input of inverter changes from low level to high level.
Figure 5:
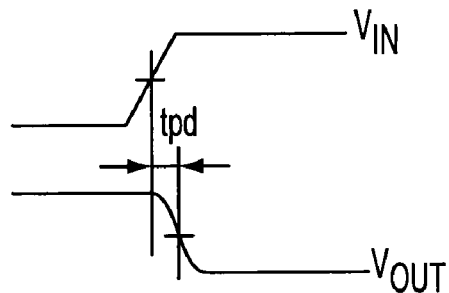

When an input signal changes from low level to high level, a transmission delay time in the inverter shown in FIG. 4 is mainly decided by N-channel transistor's ability to drive current and is shown in the following expression:

$$t_{pd} = \frac{aC}{K_n} \quad (19)$$

a: constant; and
C: load capacitance of output.

Herein, when mobility is $\mu_n$, capacitance of gate oxide film is $C_{ox}$, width of gate is W and length of gate is L, $K_n$ is given by:

$$K_n = \frac{\mu_n C_{OX} W}{L} \quad (20)$$

Because of degradation caused by the hot carrier effect, the following expression holds in the case that when $K_n$ of N-channel transistor decreases by $\Delta K_n$, $t_{pd}$ increases by $\delta$:

$$\delta = \frac{aC}{K_n} \times \Delta K_n \quad (21)$$

$$\propto \Delta K_n$$

From the expression (7), $\Delta K_n$ is given by:

$$\Delta K_n = (At_{dc})^n. \quad (22)$$

From the expression (21), $\delta = \gamma \Delta K_n$. Consequently, the following holds:

$$\frac{\delta}{\gamma} = (AT_{dc})^n. \quad (23)$$

From the expression (17) and expression (23), the following holds:

$$\delta = \gamma(ASft_{ac})^n \quad (24)$$

In the expression (24), A is a parameter depending on temperature.

For example, the expression (24) is shown from an actual measurement as the following:

$$A \propto e^{-\kappa T} \quad (25)$$

Herein, A, $t_{ac}$ and n are substituted like the following:

$$A = \frac{1}{\varepsilon_1 e^{\kappa T}} \quad (26)$$

$$t_{ac} = \tau$$

$$n = \frac{1}{\varepsilon_2}$$

In the consequent, the following is acquired.

$$\delta = \gamma\left(\frac{\tau S f}{\varepsilon_1 e^{\kappa T}}\right)^{\frac{1}{\varepsilon_2}}. \quad (27)$$

(4-2) Derivation of Expression (2) and Expression (4)

Stress S depends on the ratio of load capacitance C to width of transistor(s), which is (are) N-channel transistor or (and) P-channel transistor, rise time $T_r$ and fall time $T_f$ of input pin. Stress S is shown in the following function:

$$S = F\left(\frac{C}{W}, T_r, T_f\right) \quad (28)$$

S is computed by calculation of the following expression in a circuit simulation by the use of SPICE and the like by changing C/W, $T_r$ and $T_f$.

$$S = \frac{\int_0^T \frac{I_{ds}}{BW}\left(\frac{I_{sub}}{I_{ds}}\right)^m dt}{\left|\frac{I_{ds}}{BW}\left(\frac{I_{sub}}{I_{ds}}\right)^m\right|_{dc}}. \tag{29}$$

When S is approximated in the expression (29) by a function of C/W, the following is gained:

$$S = \alpha\left(\frac{C}{W}\right)^\beta, \tag{30}$$

where $\alpha$ and $\beta$ are constants depending on structure of circuit, $T_r$ and $T_f$.

(4-3) Derivation of the Expression (5) and (6)

In a logic block comprising three stage inverters each of which has the same delay time, when the input changes from low level to high level, $\lambda$ is shown by the following:

$$\lambda_{in} = \frac{1}{3}$$

$$\lambda_{out} = \frac{1}{3} \tag{31}$$

and when the input changes from high level to low level, $\lambda$ is shown by the following:

$$\lambda_{in} = 0$$

$$\lambda_{out} = 0 \tag{32}$$

Figure 6:
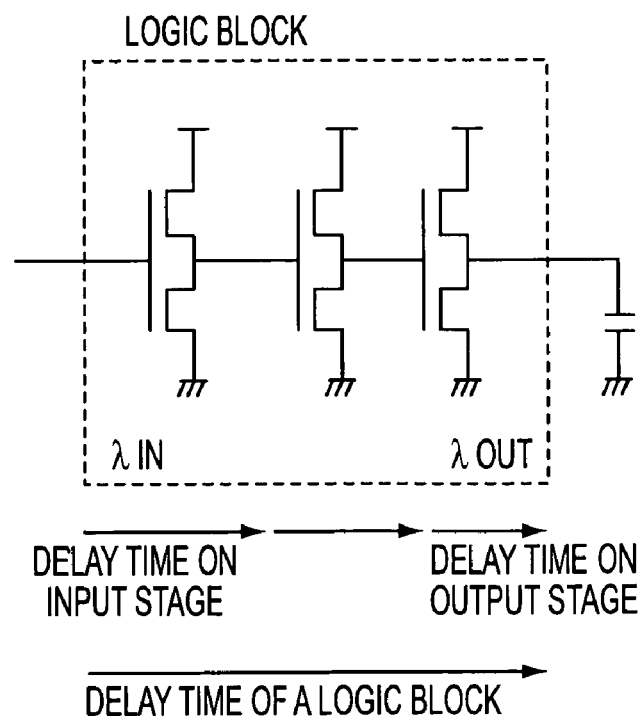
FIG. 6 shows a diagram for use in schematically describing delay time of a logic block comprising three stage inverters.

Similarly to FIG. 6, in four stage inverters each of which has the same delay time, when the input changes from low level to high level, $\lambda$ is shown by the following:

$$\lambda_{in} = \frac{1}{4}$$

$$\lambda_{out} = 0 \tag{33}$$

and when the input changes from high level to low level, $\lambda$ is shown by the following:

$$\lambda_{in} = 0$$

$$\lambda_{out} = \frac{1}{4} \tag{34}$$

(5) Effect of the Present Invention

Delay time degradation which occurs in a logic circuit owing to the hot electron effect is serious in a transistor which has large rounding of inputted waveform or large load capacitance of output.

A logic circuit inside a logic block is previously arranged and wired on LSI in small area so that transistors inside of the block have small rounding of input waveform and load capacitance of output. On the other hand, transistors connected to the input/output pin of a logic block tend to have large rounding of input waveform and load capacitance of output because distance between logic blocks and length of wires between logic blocks are determined by a tool for arranging and wiring LSI.

Therefore, it is possible to calculate accurately an degradation rate of delay time in a logic circuit caused in the hot electron effect by paying attention to the input and output pin of a logic block.

Namely, the present invention firstly calculates delay time degradation rate of an input pin and an output pin, and secondly modifies delay time by the delay time degradation rate. In consequence, the present invention provides a delay time calculation method with both high accuracy and low cost of calculation. The method of the present invention is immediately available for circuit simulation, static timing analysis.

While this invention has thus far been described in conjunction with a few embodiments thereof, it will be readily possible for those skilled in the art to put this into various other manners.

What is claimed is:

1. A method of calculating, by the use of a computer, pin-to-pin delay time $T_{iopath\_aged}$, which is delay time of a signal passing between an input pin and an output pin of a logic block, and block-to-block delay time $T_{connect\_aged}$, which is delay time of a signal passing between two said logic blocks connected to each other, comprising:

(a) calculating an amount of stress $S_{in}$ cast by the input pin and an amount of stress $S_{out}$ cast by the output pin according to the following expression:

$$S = \alpha\left(\frac{C}{W}\right)^\beta$$

where a load capacitance is represented by C[pF], constants depending on change of inputted waveform are represented by $\alpha$ and $\beta$, and width of channel of a transistor connected to a pin is represented by W[$\mu$m];

(b) calculating an aged delay time of the input pin $\delta_{in}[\%]$ and an aged delay time of the output pin $\delta_{out}[\%]$ according to the following expression:

$$\delta = \gamma\left(\frac{\tau Sf}{\epsilon_1 e^{\kappa T}}\right)^{\frac{1}{\epsilon_2}}$$

where a constant depending on physical structure of the pin is represented $\gamma$, the term of guarantee of a LSI is represented by $\tau$[hour], constants depending on process are represented by $\epsilon 1$, $\epsilon 2$ and $\kappa$, working frequency is represented by f[Hz], and absolute temperature is represented by T[K];

(c) calculating and outputting for use as values representative of circuit properties of a logic level circuit the pin-to-pin delay time $T_{iopath\_aged}$ and the block-to-block delay time $T_{connect\_aged}$ according to the following expressions:

$$T_{iopath\_aged} = T_{iopath\_fresh}(1 + \lambda_{in}\delta_{in} + \lambda_{out}\delta_{out})$$

$$T_{connect\_aged} = T_{connect\_fresh}(1 + \lambda_{out}\delta_{out})$$

where pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at an input stage and an output stage to whole delay time occurred from the input pin to the output pin are represented by $\lambda_{in}$ and $\lambda_{out}$.

2. A method of calculating, by the use of a computer, a delay time occurred to a signal passing through a logic level circuit that consists of a plurality of logic blocks, comprising:

(a) calculating pin-to-pin delay time $T_{iopath\_aged}$, which is delay time of a signal passing between an input pin and an output pin of a bale block, and block-to-block delay time $T_{connect\_aged}$, which is delay time of a signal passing between two said logic blocks connected to each other, comprising:

(i) calculating an amount of stress $S_{in}$ cast by the input pin and an amount of stress $S_{out}$ cast by the output pin according to the following expression:

$$S = \alpha\left(\frac{C}{W}\right)^\beta$$

where a load capacitance is represented by C[pF], constants depending on change of inputted waveform are represented by $\alpha$ and $\beta$, and width of channel of a transistor connected to a pin is represented by W[μm];

(ii) calculating an aged delay time of the input pin $\delta_{in}$[%] and an aped delay time of the output pin $\delta_{out}$[%] according to the following expression:

$$\delta = \gamma\left(\frac{\tau S f}{\varepsilon_1 e^{\kappa T}}\right)^{\frac{1}{\varepsilon_2}}$$

where a constant depending on physical structure of the pin is represented by $\gamma$, the term of guarantee of a LSI is represented by $\tau$ [hour], constants depending on process are represented by $\varepsilon 1$, $\varepsilon 2$ and $\kappa$, working frequency is represented by f[Hz], and absolute temperature is represented by T[K];

(iii) calculating and outputting for use as values representative of circuit properties of the logic level circuit the pin-to-pin delay time $T_{iopath\_aged}$ and the block-to-block delay time $T_{connect\_aged}$ according to the following expressions:

$T_{iopath\_aged} = T_{iopath\_fresh}(1+\lambda_{in}\delta_{in}+\lambda_{out}\delta_{out})$ $T_{connect\_aged} = T_{connect\_fresh}(1+\lambda_{out}\delta_{out})$ where pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at an input stage and an output stage to whole delay time occurred from the input pin to the output pin are represented by $\lambda_{in}$ and $\lambda_{out}$; and (b) calculating and outputting for use as a value representative of a circuit property of said logic level circuit the delay time of the logic level circuit from the result of step (a).

3. A computer-readable medium incorporating a program of instructions for calculating, by using a computer, pin-to-pin delay time $T_{iopath\_aged}$, which is delay time of a signal passing between an input pin and an output pin of a logic block, and block-to-block delay time $T_{connect\_aged}$, which is delay time of a signal passing between two said logic blocks connected to each other, the program making a computer execute the following processes:

(a) calculating an amount of stress $S_{in}$ cast by the input pin and an amount of stress $S_{out}$ cast by the output pin according to the following expression:

$$S = \alpha\left(\frac{C}{W}\right)^\beta$$

where a load capacitance is represented by C[pF], constants depending on change of inputted waveform are represented by $\alpha$ and $\beta$, and width of channel of a transistor connected to a pin is represented by W[μm];

(b) calculating an aged delay time of the input pin $\delta_{in}$[%] and an aged delay time of the output pin $\delta_{out}$[%] according to the following expression:

$$\delta = \gamma\left(\frac{\tau S f}{\varepsilon_1 e^{\kappa T}}\right)^{\frac{1}{\varepsilon_2}}$$

where that a constant depending on physical structure of the pin is represented by $\gamma$, the term of a guarantee of a LSI is represented by $\tau$[hour], constants depending on process are represented by $\varepsilon 1$, $\varepsilon 2$ and $\kappa$, working frequency is represented by f[Hz], and absolute temperature is represented by T[K];

(c) calculating and outputting for use as values representative of circuit properties of a logic level circuit the pin-to-pin delay time $T_{iopath\_aged}$ and the block-to-block delay time $T_{connect\_aged}$ according to the following expressions:

$T_{iopath\_aged} = T_{iopath\_fresh}(1+\lambda_{in}\delta_{in}+\lambda_{out}\delta_{out})$ $T_{connect\_aged} = T_{connect\_fresh}(1+\lambda_{out}\delta_{out})$ where pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at an input stage and an output stage to whole delay time occurred from the input pin to the output pin are represented by $\lambda_{in}$ and $\lambda_{out}$, respectively.

4. A computer-readable medium incorporating a program of instructions for calculating a delay time occurred to a signal passing through a logic level circuit that consists of a plurality of logic blocks, the program making a computer execute the following processes:

(a) calculating pin-to-pin delay time $T_{iopath\_aged}$, which is delay time of a signal passing between an input pin and an output pin of a logic block, and block-to-block delay time $T_{connect\_aged}$, which is delay time of a signal passing between two said logic blocks connected to each other, said calculating comprises:

(i) calculating an amount of stress $S_{in}$ cast by the input pin and an amount of stress $S_{out}$ cast by the output pin according to the following expression:

$$S = \alpha\left(\frac{C}{W}\right)^\beta$$

where a load capacitance is represented by C[pF], constants depending on change of inputted waveform are represented by α and β, and width of channel of a transistor connected to a pin is represented by W[μm];

(ii) calculating an aged delay time of the input pin $\delta_{in}$[%] and an aged delay time of the output pin $\delta_{out}$[%] according to the following expression:

$$\delta = \gamma \left( \frac{\tau S f}{\varepsilon_1 e^{\kappa T}} \right)^{\frac{1}{\varepsilon_2}}$$

where that a constant depending on physical structure of the pin is represented by γ, the term of a guarantee of a LSI is represented by τ [hour], constants depending on process are represented by ε1, ε2 and κ, working frequency is represented by f[Hz], and absolute temperature is represented by T[K];

(iii) calculating and outputting for use as values representative of circuit properties of said logic level circuit the pin-to-pin delay time $T_{iopath\_aged}$ and the block-to-block delay time $T_{connect\_aged}$ according to the following expressions:

$$T_{iopath\_aged} = T_{iopath\_fresh}(1 + \lambda_{in}\delta_{in} + \lambda_{out}\delta_{out})$$

$$T_{connect\_aged} = T_{connect\_fresh}(1 + \lambda_{out}\delta_{out})$$

where pin-to-pin delay time and block-to-block delay time calculated ignoring aging caused by hot carrier effect are represented by $T_{iopath\_fresh}$[ps] and $T_{connect\_fresh}$[ps], and ratios of delay times occurred at an input stage and an output stage to whole delay time occurred from the input pin to the output pin are represented by $\lambda_{in}$ and $\lambda_{out}$, respectively; and (b) calculating and outputting for use as a value representative of a circuit property of said logic level circuit the delay time of the logic level circuit from to result of step (a).

* * * * *

UNITED STATES PATENT AND TRADEMARK OFFICE
CERTIFICATE OF CORRECTION

PATENT NO. : 6,975,979 B2
APPLICATION NO. : 09/347409
DATED : December 13, 2005
INVENTOR(S) : Tetsuya Akimoto and Morihisa Hirata It is certified that error appears in the above-identified patent and that said Letters Patent is hereby corrected as shown below:

(73) Assignee: [NEC Corporation, Tokyo (JP)] should read; NEC Electronics Corporation, Kanagawa (JP)

Signed and Sealed this

Twenty-ninth Day of August, 2006

JON W. DUDAS
*Director of the United States Patent and Trademark Office*